US009681550B2

(12) United States Patent
Fjelstad (10) Patent No.: US 9,681,550 B2
(45) Date of Patent: Jun. 13, 2017

(54) METHOD OF MAKING A CIRCUIT SUBASSEMBLY

(76) Inventor: Joseph C. Fjelstad, Maple Valley, WA (US)

( * ) Notice: Subject to any disclaimer, the term of this patent is extended or adjusted under 35 U.S.C. 154(b) by 979 days.

(21) Appl. No.: 12/200,749

(22) Filed: Aug. 28, 2008

(65) Prior Publication Data

US 2009/0056997 A1 Mar. 5, 2009

Related U.S. Application Data (63) Continuation-in-part of application No. 12/119,287, filed on May 12, 2008, now abandoned, and a continuation-in-part of application No. 12/163,870, filed on Jun. 27, 2008, now Pat. No. 7,926,173, and a continuation-in-part of application No. 12/191,544, filed on Aug. 14, 2008, now Pat. No. 7,981,703, and (Continued)

(51) Int. Cl.
*H05K 1/18* (2006.01)
*H05K 1/05* (2006.01)
*H05K 3/28* (2006.01)
*H05K 3/46* (2006.01)

(52) U.S. Cl.
CPC .......... *H05K 1/185* (2013.01); *H01L 2924/14* (2013.01); *H01L 2924/3025* (2013.01); *H05K 1/056* (2013.01); *H05K 3/284* (2013.01); *H05K 3/4644* (2013.01); *H05K 2201/0969* (2013.01); *H05K 2201/2018* (2013.01); *H05K 2203/0156* (2013.01); *H05K 2203/1469* (2013.01); *Y10T 29/49124* (2015.01); *Y10T 29/49146* (2015.01)

(58) Field of Classification Search
CPC ...... H05K 1/185; H05K 3/284; H05K 3/0026; H01L 21/56; Y10T 29/49146

USPC .... 29/829.83, 831, 832, 852, 840, 837, 841; 257/687, 787, 707, 684; 361/406, 404, 361/400, 403; 357/74, 71; 438/106, 124, 438/126, 127
See application file for complete search history.

(56) References Cited

U.S. PATENT DOCUMENTS 4,635,356 A    1/1987  Ohuchi
4,893,216 A *  1/1990  Hagner ........................ 361/774
(Continued)

OTHER PUBLICATIONS

EP Application No. 08756454.8, European Search Report dated Mar. 21, 2012.

*Primary Examiner* — Peter DungBa Vo
*Assistant Examiner* — Jeffrey T Carley
(74) *Attorney, Agent, or Firm* — Edward P Heller, III (57) ABSTRACT

A frame 100 containing aperture(s) 102, 103, 104 is positioned on and joined to a permanent substrate 206a or temporary substrate 206b. Electrical component(s) 202, 203, 204 are placed into respective aperture(s) 102, 103, 104 with the leads 504, 1002 of the component(s) 202, 203, 204 positioned on and attached to the permanent substrate 206a or the temporary substrate 206b. Then an encapsulant 402, electrically insulating, but preferably thermally conductive, envelops the component(s) 102, 103, 104. At this point, temporary substrate 206b may be removed exposing component leads 1002. Or, if component(s) 102, 103, 104 are mounted on permanent substrate 206a, vias 502 extend from the surface of substrate 206a to leads 504. With leads 504, 1002 exposed, the completed subassembly 500, 1000 may be incorporated into various forms of reverse-interconnection process (RIP) assemblies as detailed in related applications.

5 Claims, 6 Drawing Sheets

Related U.S. Application Data a continuation-in-part of application No. 12/170,426, filed on Jul. 9, 2008, now Pat. No. 8,510,935, and a continuation-in-part of application No. 12/182,043, filed on Jul. 29, 2008, now abandoned, and a continuation-in-part of application No. 12/187,323, filed on Aug. 6, 2008, now abandoned.

(60) Provisional application No. 60/966,643, filed on Aug. 28, 2007, provisional application No. 61/038,564, filed on Mar. 21, 2008, provisional application No. 61/039,059, filed on Mar. 24, 2008, provisional application No. 61/075,238, filed on Jun. 24, 2008.

(56) References Cited

U.S. PATENT DOCUMENTS

| | | | |
|---|---|---|---|
| 4,940,881 A * | 7/1990 | Sheets | B23K 26/0656 219/121.25 |
| 5,045,914 A * | 9/1991 | Casto et al. | 257/693 |
| 5,048,179 A * | 9/1991 | Shindo | G06K 19/07745 174/535 |
| 5,182,632 A * | 1/1993 | Bechtel | H01L 23/3675 257/713 |
| 5,353,498 A * | 10/1994 | Fillion et al. | 29/840 |
| 5,734,555 A | 3/1998 | McMahon | |
| 6,780,762 B2 * | 8/2004 | Ireland | 438/640 |
| 2003/0057544 A1 | 3/2003 | Nathan | |
| 2007/0035015 A1 | 2/2007 | Hsu | |
| 2007/0102803 A1 | 5/2007 | Gann | |

* cited by examiner

METHOD OF MAKING A CIRCUIT SUBASSEMBLY

CROSS-REFERENCE TO RELATED APPLICATIONS

This application claims the benefit of U.S. Provisional Application No. 60/966,643, filed on Aug. 28, 2007, hereby incorporated by reference in its entirety; U.S. Provisional Application No. 61/038,564, filed on Mar. 21, 2008, hereby incorporated by reference in its entirety; U.S. Provisional Application No. 61/039,059 filed on Mar. 24, 2008, hereby incorporated by reference in its entirety; and U.S. Provisional Application No. 61/075,238 filed on Jun. 24, 2008, hereby incorporated by reference in its entirety.

This application is a continuation-in-part application of pending U.S. patent application Ser. No. 12/119,287, ELECTRONIC ASSEMBLIES WITHOUT SOLDER AND METHODS FOR THEIR MANUFACTURE; U.S. patent application Ser. No. 12/163,870, ELECTRONIC ASSEMBLIES WITHOUT SOLDER AND METHODS FOR THEIR MANUFACTURE; U.S. patent application Ser. No. 12/191,544, ELECTRONIC ASSEMBLIES WITHOUT SOLDER AND METHODS FOR THEIR MANUFACTURE; U.S. patent application Ser. No. 12/170,426, ELECTRONIC ASSEMBLIES WITHOUT SOLDER AND METHODS FOR THEIR MANUFACTURE; U.S. patent application Ser. No. 12/182,043, ASSEMBLY OF ENCAPSULATED ELECTRONIC COMPONENTS TO A PRINTED CIRCUIT BOARD; and U.S. patent application Ser. No. 12/187,323 SYSTEM FOR THE MANUFACTURE OF ELECTRONIC ASSEMBLIES WITHOUT SOLDER hereby incorporated by reference in their entirety.

COPYRIGHT NOTICE AND PERMISSION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to the field of electronic assembly and more specifically to the manufacture and assembly of solderless electronic products.

BACKGROUND ART

Historically, most electronic products have been assembled using a solder material and a soldering process. This has always had disadvantages, and a number of new trends are revealing or exacerbating other disadvantages.

One set of such disadvantages relates to solder materials. Tin/lead type solders (e.g., Sn63/Pb37) have been widely used since the earliest days of the electronics industry. Unfortunately, both tin and especially lead have serious chemical disadvantages. For these two metals, mining the ores, refining those ores, working with the refined metals during manufacturing, being exposed to substances including those in manufactured products, and disposing of the products at the ends of their life cycles are all potentially damaging to human and animal health and to the environment.

Recently, human health and environmental concerns about tin/lead type solders have resulted in the Directive on the Restriction of the Use of Certain Hazardous Substances in Electrical and Electronic Equipment (commonly referred to as the Restriction of Hazardous Substances Directive or RoHS) in the European Union. This directive restricts the use of six hazardous materials, including lead, in the manufacture of various types of electronic and electrical equipment. This directive is also closely linked with the Waste Electrical and Electronic Equipment Directive (WEEE) 2002/96/EC, which sets collection, recycling, and recovery targets for electrical goods. Together these directives are part of a growing world-wide legislative initiative to solve the problem of electronic device waste.

To some extent the electronics industry has always been searching for a practical substitute for tin/lead type solders, and legislative initiatives like those just noted are now motivating a number of changes. Today a common substitute for tin/lead type solders are SAC type solder varieties, which are alloys containing tin (Sn), silver (Ag), and copper (Cu). But this is merely a compromise. Mining, refining, working during manufacturing, exposure from manufactured products, and disposal are still all issues for tin, silver, and copper. Furthermore, SAC solder processes are prone to other problems, such as the formation of shorts (e.g., "tin whiskers") and opens if surfaces are not properly prepared. It follows that the undue use of some materials, like those in solders, are generally undesirable in electronic assemblies.

Another set of disadvantages in the solder-based assembly of electronic products is the high temperature processes that are inherently required. The use of heat on and around many electronic components has always been undesirable. As a general principle, the heating of electronic components increases their failure rate in later use and beyond a certain point outright destroys such components. Tin/lead solders melt at relatively low temperatures and their use has generally been tolerable for many components. This is not always the same for SAC type solders, which melt a much higher temperatures (e.g., ~40° C. or hotter). The likelihood of component damage is much higher, resulting in assemblies that fail during post-manufacturing testing as well as in-the-field failures. Additionally, generating and managing the heat during manufacturing have increased energy, safety, and other costs. It therefore follows that the undue use of heat-based manufacturing processes, like soldering, is also generally undesirable in electronic assemblies.

Increasingly yet another set of disadvantages in the solder-based assembly of electronic products is one related to the "adding" of materials. When a material, like solder, is added between two components to hold them together the additional material inherently has to occupy some space. Solder contain dense metals, which adds to the ultimate weight of electronic products. The use of liquid-state materials, like liquid stage solder during manufacturing, often requires designing in additional space around leads, terminals, and connection pads to account for the ability of the liquid to flow easily and to potentially short to other leads, terminals, pads, etc. Liquid solders have high surface tensions and effects from this also usually require major design consideration. These are all factors that can require consideration as designers increasingly strive to miniaturize electronic assemblies. Accordingly, it further follows that the undue use of any additional material in manufactured assemblies and in manufacturing processes, again like solder, is generally undesirable in the resulting electronic assemblies.

BRIEF SUMMARY OF THE INVENTION

It is an object of the present invention to provide an apparatus that includes components joined without solder.

It is also an object of the present invention to provide a method of joining electrical components without solder.

A frame containing aperture(s) is positioned on and joined to a temporary or permanent substrate. A pick and place machine, for example, places electrical component(s) into respective aperture(s) with the leads of the component(s) positioned on and attached to the substrate. Then an encapsulant electrically insulating, but preferably thermally conductive, envelops the component(s). At this point, a temporary substrate may be removed exposing component leads. Or, if components are mounted on a permanent substrate, vias extend from the surface to the leads. With leads exposed, the completed subassembly may be incorporated into various forms of reverse-interconnection process (RIP) assemblies as detailed in this patent application's counterparts.

Among the advantages of the present invention is the ability to lessen accuracy requirements for component pick and place equipment. That is, apertures help guide components to their correct placement on a substrate, thus easing the tolerances necessary for pick and place equipment.

Another advantage is the reduction of the amount of material necessary for component encapsulation. A frame containing apertures reduces the amount of encapsulant required in an RIP assembly and can be made of less expensive material. In addition, if the frame is thermally conductive, it will act as a heat spreader and heat sink and may offer other electrical benefits by shielding parts from one another and potentially serving as a reference ground for subsequently produced circuits.

This and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE SEVERAL VIEWS OF THE DRAWINGS

The purposes and advantages of the present invention will be apparent from the following detailed description in conjunction with the appended figures of drawings in which.

In the various figures of the drawings, like references are used to denote like or similar elements or steps.

In the following description and in the accompanying drawings, specific terminology and drawing symbols are set forth to provide a thorough understanding of the present invention. In some instances, the terminology and symbols may imply specific details that are not required to practice the invention. For example, the interconnection between conductor elements of components (i.e., component I/O leads) may be shown or described as having multi-conductors interconnecting to a single lead or a single conductor signal line connected to multiple component contacts within or between devices. Thus each of the multi-conductor interconnections may alternatively be a single-conductor signaling, control, power or ground line and vice versa. Circuit paths shown or described as being single-ended may also be differential, and vice-versa. The interconnected assembly may be comprised of standard interconnections; microstrip or stripline interconnections and all signal lines of the assembly may be either shielded or unshielded.

DETAILED DESCRIPTION OF THE INVENTION

Figure 1:
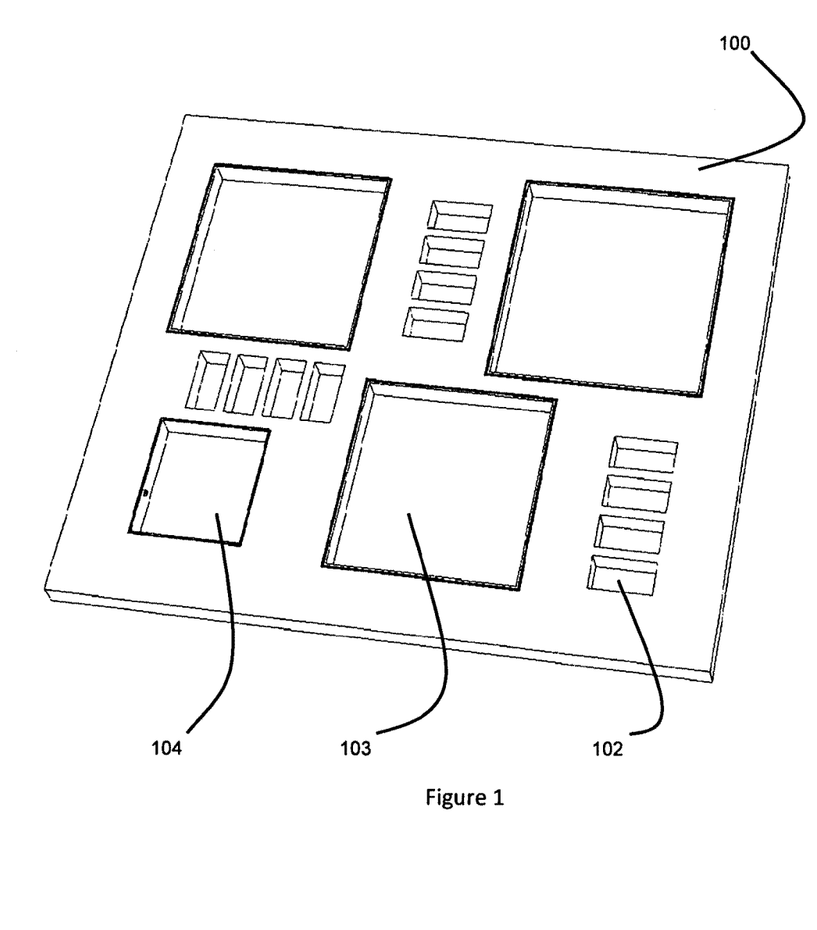
FIG. 1 is a perspective view of a frame with apertures.
Figure 2:
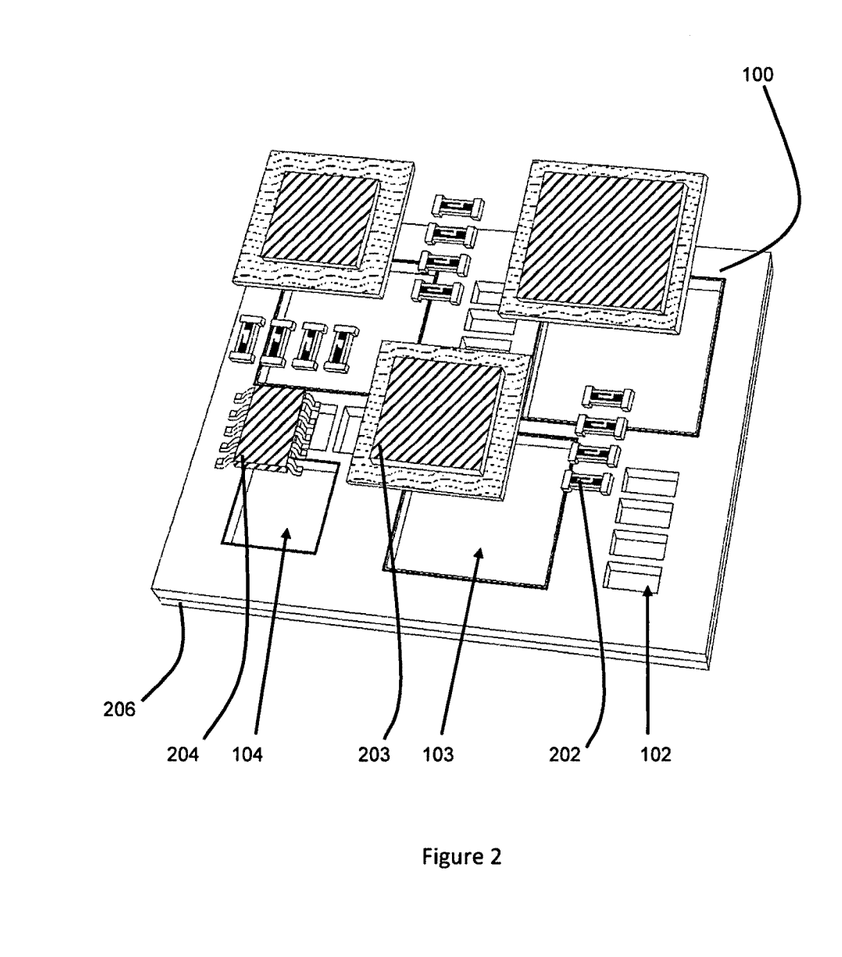
FIG. 2 is a perspective view of components and the frame, with the apertures situated under respective components and with the frame joined to a substrate.

FIG. 1 shows a frame 100 with apertures 102, 103, and 104 into which electrical components may be inserted. The frame 100 may be continuous, sectioned, in multiple discrete pieces or temporarily attached to other pieces of frame in anticipation of creating a finished structure which will have flexible areas in the completed assembly to allow for subsequent folding or bending of the assembly. FIG. 2 shows electrical components (for example discrete component 202, land grid array component 203, and gull wing component 204) in position over respective apertures 102, 103, and 104 of frame 100. Frame 100 sits on a substrate 206 which may be either temporarily or permanently attached to frame 100.

Figure 3:
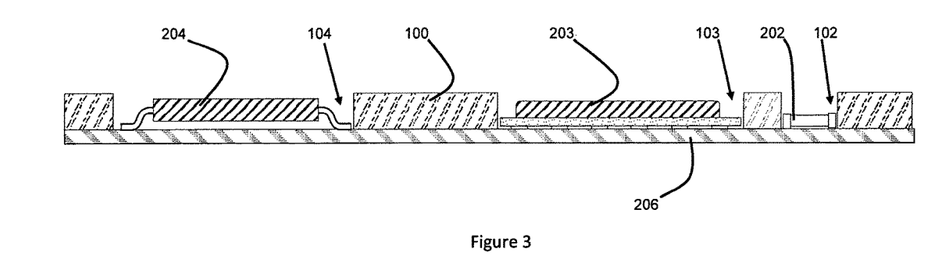
FIG. 3 is a section of the frame joined to the substrate with the components situated in respective apertures and joined to the substrate.

FIG. 3 shows a section of frame 100 situated on substrate 206 with components 202, 203, and 204 inserted into respective apertures 102, 103, and 104 and attached to substrate 206.

Figure 4:
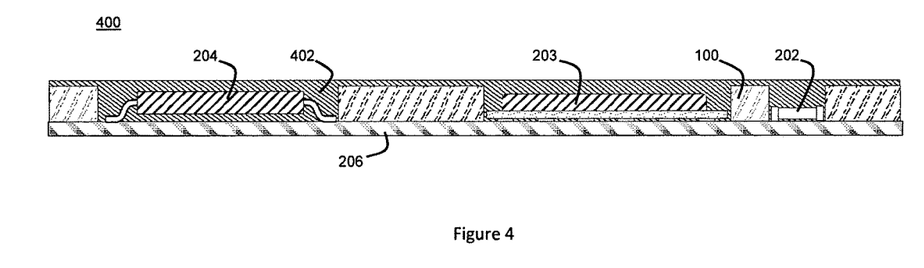
FIG. 4 is a section of the frame, apertures, components and substrate as shown in FIG. 3 with the addition of encapsulating material.

FIG. 4 shows subassembly 400, including frame 100 and substrate 206, with electrically insulating material 402 encapsulating components 202, 203, and 204. Material 402 can provide mechanical support to components 202, 203, and 204, can adhere components 202, 203, and 204 to frame 100. Frame 100 may be created from any suitable material including unclad or metal clad laminate, a metal treated (e.g. anodizing of aluminum) or coated with a suitable resin so as to provide an insulating layer to prevent shorting to component leads. When made or coated with metal, frame 100 could serve a secondary electrical function, as, for example, a ground, power or combination thereof if properly prepared. If thermally conductive, frame 100 can act as a heat spreader and/or heat sink.

Figure 5:
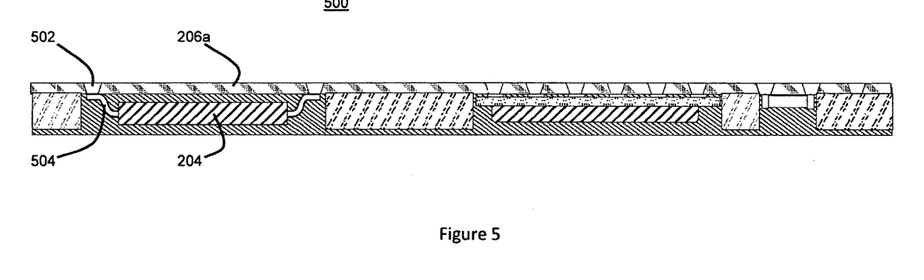
FIG. 5 is a section of the frame, apertures, components, substrate, and encapsulating material as shown in FIG. 4 with the addition of vias exposing leads of the components.

Substrate 206a is electrically insulating and permanently mounted to frame 100, as shown in FIG. 5, and access to leads of components is provided. For example, via 502 extends through substrate 206a and exposes lead 504 of component 204. A method of forming via 502 includes laser drilling. One or more vias may extend to and expose spot(s) of the frame 100 for electrical purposes if desired and the frame is capable. In this case, frame 100 may be made from unclad, metal clad, substantially insulated metal, or other electrically conductive material.

Figure 6:
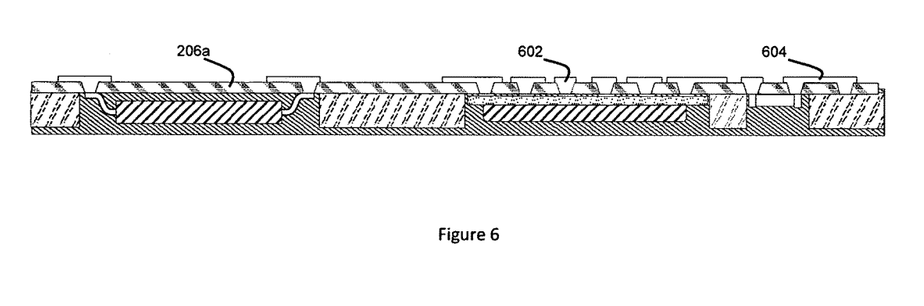
FIG. 6 is a section of the frame, apertures, components, substrate, and encapsulating material as shown in FIG. 5 with the addition of plating material filling vias and forming leads and traces.
Figure 7:
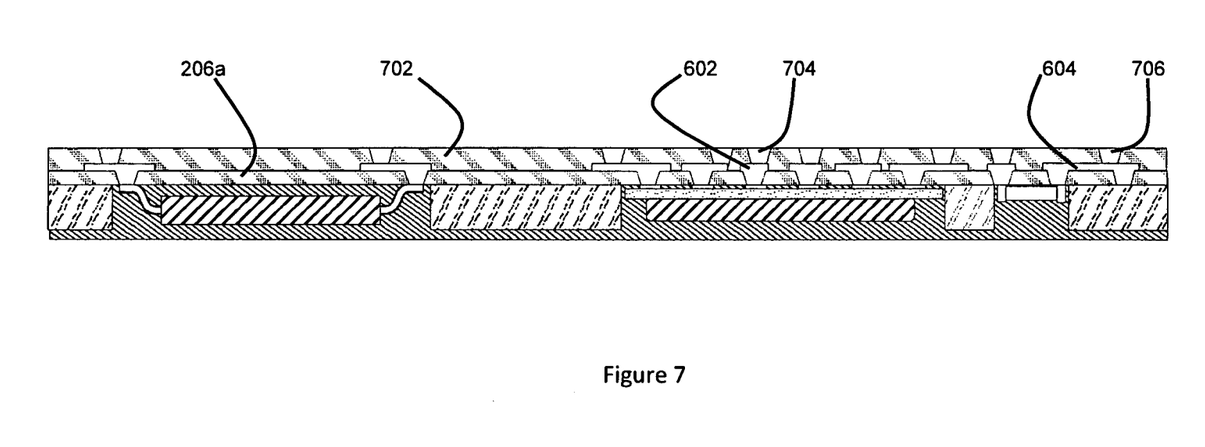
FIG. 7 is a section of the frame, apertures, components, substrate, encapsulating material, and plating material as shown in FIG. 6 with the addition of insulating material covering the plating material and a second set of vias extending through the insulating material exposing selected portions of the plating material.

Subassembly 500 may be incorporated into a RIP assembly. That is, as shown in FIG. 6, vias may be filled or plated with electrically conductive material, in many cases copper, to form leads and traces, such as lead 602 and trace 604 on substrate 206a. In turn, substrate 206a, and leads and traces formed on substrate 206a, may be covered with insulating material 702 as shown in FIG. 7. Access to leads and traces, such as lead 602 and trace 604, may be provided by vias extending through insulating material 702. For example, via 704 provides access to lead 602 and via 706 provides access to trace 604.

Figure 8:
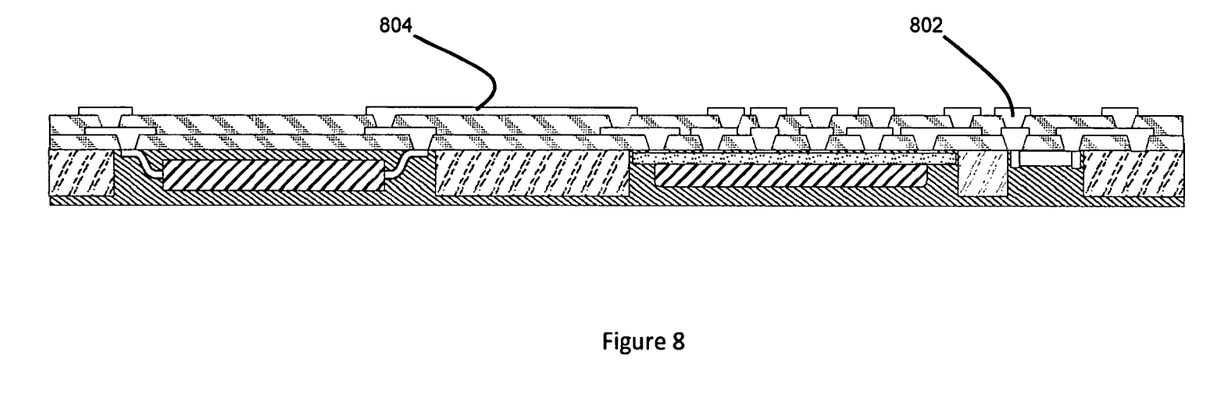
FIG. 8 is a section of the subassembly of FIG. 7 with additional plating material filling the second set of vias and forming leads and traces.

Additional layers may be formed as required. In FIG. 8, the vias provided in FIG. 7 have been filled with electrically conductive material to form additional leads and traces, such as lead 802 and trace 804.

Figure 9:
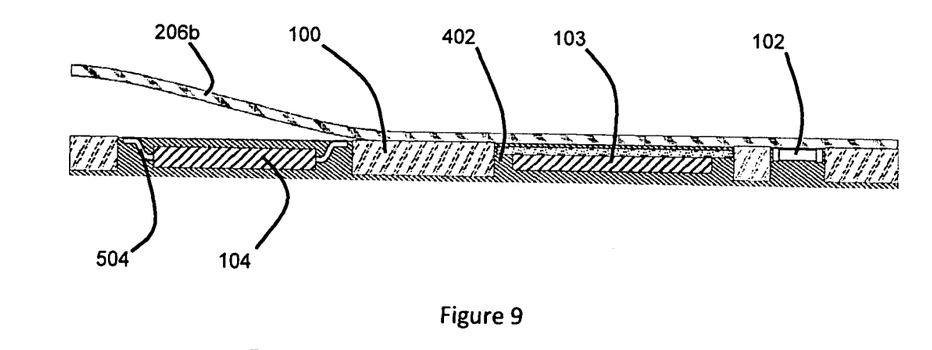
FIG. 9 is a section of the subassembly of FIG. 4 with a temporary substrate in the process of being removed.
Figure 10:
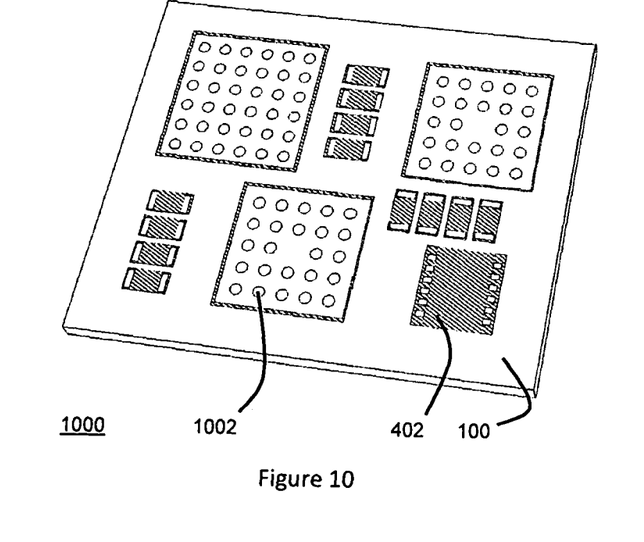
FIG. 10 is a perspective view of the subassembly of FIG. 9, shown after the temporary substrate is removed, showing leads of components exposed.

As an alternative to the subassembly shown in FIG. 5, substrate 206b may be temporarily attached to frame 100, components 102, 103, and 104, and insulating material 402. As shown in FIG. 9, substrate 206b may be detached, thus exposing component leads, such as lead 504. Vias are not necessary for a first layer in this case. In the manner shown in FIGS. 6, 7, and 8, layers of leads, traces, electrically insulating material, and vias may be built on an exposed side of material 402 and frame 100. A perspective view of the exposed side of material 402 and frame 100, with exposed leads such as lead 1002, is shown in FIG. 10.

The foregoing description details specific embodiments of the invention and is included for illustrative purposes. However, it will be apparent to one skilled in the art that many combinations and permutations of the described embodiments are possible while remaining within the scope and spirit of the invention. For example, numerous similar or different types of electrical components may be incorporated into assemblies. Examples of types of electrical components include, but are not limited to, discrete or analog components, gull wing components, IC, LGA, BGA, CGA, QFN, QFP, TSOP, OFN, and PGA components, and other lead frame package and area array components. Preferably such components are fully tested and burned in before being integrated into a RIP assembly.

As indicated above, this application is a continuation-in-part of applications U.S. patent application Ser. Nos. 12/119,287, 12/163,870, 12/170,426, 12/182,043, and 12/191,544, hereby incorporated by reference in their entirety. The present invention may comprise a set of subassemblies 400 and 1000 of assemblies disclosed and described in the above referenced applications. That is, subassemblies (for example, subassembly 500) can have vias extending through the substrate 206a to lead terminations and/or traces (Ser. No. 12/119,287). Alternatively, subassemblies without substrates (for example, subassembly 1000) may have leads and traces formed on the first layer. An assembly may be flexible (Ser. No. 12/163,870). That is, substrate 206 of subassembly 400 may be flexible and, if frame 100 is removed, a flexible RIP assembly may be created. The subassemblies, with or without substrates, may be mounted front to front or back to back (Ser. Nos. 12/119,287 and 12/191,544). The subassemblies may be mounted on a foil base (Ser. No. 12/170,426). And the subassemblies may be joined and interconnected to a central bonding material which is connected to a printed circuit board (Ser. No. 12/182,043).

While various embodiments have been described above, it should be understood that they have been presented by way of example only, and that the breadth and scope of the invention should not be limited by any of the above described exemplary embodiments, but should instead be defined only in accordance with the following claims and their equivalents.

What is claimed is:

1. A method of making a circuit subassembly comprising: in order:
    joining a frame, the frame having two planar surfaces, parallel to each other and defining a frame top side and a frame bottom side, and further having a plurality of apertures, each aperture extending from the frame top side to the frame bottom side, to a substrate top side of a substantially planar substrate, wherein the substrate consists of an electrically insulating planar element; and wherein the frame bottom side abuts and covers the substrate top side except where the plurality of apertures expose portions of the substrate top side;
    placing a plurality of burned-in, packaged components on the substrate top side so that the plurality of burned-in packaged components are each contained within respective ones of the plurality of apertures, each of the plurality of burned-in packaged components having at least one first lead, the at least one first lead contacting the substrate top side;
    employing a first electrically insulating material to cover the plurality of burned-in packaged components while still permitting said at least one lead to continue to contact said substrate top side, the first electrically insulating material further forming a substantially uniform flat surface spaced from said frame top side, and spanning said plurality of apertures; and
    laser drilling at least one via through the other side of the substrate to expose the at least one first lead of the burned-in packaged component; and
    filling the at least one via with an electrically conductive material.

2. The method of claim 1 wherein the electrically conductive material forms at least one second lead.

3. The method of claim 2 further comprising:
    forming a second layer of an electrically insulating material on the substrate wherein the second layer covers the at least one second lead.

4. The method of claim 3 further comprising:
    forming a second via extending through the second layer of electrically insulating material exposing the at least one second lead.

5. The method of claim 4 further comprising:
    filling the second via with a second electrically conductive material.

* * * * *